(12) United States Patent
Hiroki et al.

(10) Patent No.: US 11,317,525 B2
(45) Date of Patent: Apr. 26, 2022

(54) ELECTRONIC DEVICE

(71) Applicant: SEMICONDUCTOR ENERGY LABORATORY CO., LTD., Atsugi (JP)

(72) Inventors: Masaaki Hiroki, Kanagawa (JP); Haruki Katagiri, Kanagawa (JP); Shinya Okano, Shizuoka (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 17/321,632

(22) Filed: May 17, 2021

(65) Prior Publication Data

US 2021/0274664 A1 Sep. 2, 2021

Related U.S. Application Data

(63) Continuation of application No. 15/646,400, filed on Jul. 11, 2017, now Pat. No. 11,013,132, which is a
(Continued)

(30) Foreign Application Priority Data

Jul. 16, 2013 (JP) .................................. 2013-147187

(51) Int. Cl.
*G06F 1/16* (2006.01)
*H05K 5/00* (2006.01)
(Continued)

(52) U.S. Cl.
CPC ........... *H05K 5/0086* (2013.01); *G04G 17/04* (2013.01); *G04G 17/08* (2013.01); *H05K 7/02* (2013.01)

(58) Field of Classification Search
CPC ...... G06F 1/163; G06F 1/1641; G06F 1/1652; G06F 1/1635; H05K 5/0086; H05K 7/02
See application file for complete search history.

(56) References Cited

U.S. PATENT DOCUMENTS 5,194,857 A 3/1993 Gomez
5,416,730 A 5/1995 Lookofsky
(Continued)

FOREIGN PATENT DOCUMENTS

CN 001649474 A 8/2005
CN 002752827 Y 1/2006
(Continued)

OTHER PUBLICATIONS

International Search Report (Application No. PCT/JP2014/068654) Dated Nov. 4, 2014.
(Continued)

*Primary Examiner* — Hung S. Bui
*Assistant Examiner* — Sagar Shrestha
(74) *Attorney, Agent, or Firm* — Nixon Peabody LLP; Jeffrey L. Costellia

(57) ABSTRACT

An electronic device of a novel embodiment, specifically an arm-worn electronic device used while being worn on an arm, is provided. An arm-worn secondary battery used while being worn on an arm is provided. An electronic device is provided, which includes a structure body having a curved surface as a support structure body, a flexible secondary battery including a film as an exterior body over the curved surface of the support structure body, and a display portion including a plurality of display elements between a pair of films over the secondary battery. The plurality of display elements and the secondary battery overlap with each other at least partly. It is possible to provide an electronic device which has a small maximum thickness of 1 cm or less and
(Continued)

a light weight of 50 g or less even when an arm-worn secondary battery is provided with a display portion.

3 Claims, 10 Drawing Sheets

Related U.S. Application Data continuation of application No. 14/328,947, filed on Jul. 11, 2014, now Pat. No. 9,713,271.

(51) Int. Cl.
*G04G 17/04* (2006.01)
*G04G 17/08* (2006.01)
*H05K 7/02* (2006.01)

(56) References Cited

U.S. PATENT DOCUMENTS

| | | | |
|---|---|---|---|
| 6,599,659 | B1 | 7/2003 | Endo et al. |
| 6,664,005 | B2 | 12/2003 | Kezuka et al. |
| 6,731,022 | B2 | 5/2004 | Silverman |
| 7,460,085 | B2 | 12/2008 | Ishii |
| RE40,663 | E | 3/2009 | Silverman |
| 7,518,959 | B2 | 4/2009 | Akaiwa et al. |
| 7,722,245 | B2 | 5/2010 | Baba et al. |
| RE42,773 | E * | 10/2011 | Tuttle ............... H04L 29/12801 235/492 |
| 8,040,456 | B2 | 10/2011 | Yamazaki et al. |
| 8,218,105 | B2 | 7/2012 | Yamazaki et al. |
| 8,319,725 | B2 | 11/2012 | Okamoto et al. |
| 8,367,440 | B2 | 2/2013 | Takayama et al. |
| 8,415,208 | B2 | 4/2013 | Takayama et al. |
| 8,427,420 | B2 | 4/2013 | Yamazaki et al. |
| 8,634,041 | B2 | 1/2014 | Yamazaki et al. |
| 8,929,085 | B2 | 1/2015 | Franklin et al. |
| 9,158,285 | B2 * | 10/2015 | Vondle ............. G04G 17/04 |
| 9,202,987 | B2 | 12/2015 | Takayama et al. |
| 9,274,562 | B2 | 3/2016 | Franklin et al. |
| 9,557,874 | B2 | 1/2017 | Franklin et al. |
| 9,608,004 | B2 | 3/2017 | Takayama et al. |
| 10,547,031 | B2 * | 1/2020 | Kim ............ H01M 50/116 |
| 2003/0017388 | A1 * | 1/2003 | Furusaki ........... H01M 50/183 429/162 |
| 2005/0174302 | A1 | 8/2005 | Ishii |
| 2005/0189906 | A1 | 9/2005 | Sun |
| 2006/0202618 | A1 | 9/2006 | Ishii et al. |
| 2007/0033847 | A1 * | 2/2007 | Tanaka ............. G06F 1/163 40/661.05 |
| 2007/0190402 | A1 * | 8/2007 | Kumeuchi .......... H01M 50/30 429/53 |
| 2008/0002527 | A1 * | 1/2008 | Ishii ............... G04G 9/02 368/239 |
| 2008/0130421 | A1 * | 6/2008 | Akaiwa ............ G04G 9/00 368/82 |
| 2008/0291225 | A1 | 11/2008 | Arneson |
| 2009/0071952 | A1 | 3/2009 | Kuwabara |
| 2010/0029327 | A1 | 2/2010 | Jee |
| 2010/0239907 | A1 | 9/2010 | Izumi |
| 2010/0297494 | A1 * | 11/2010 | Chen ............. H01M 50/116 429/179 |
| 2011/0249378 | A1 | 10/2011 | Yoo |
| 2012/0069511 | A1 | 3/2012 | Azera |
| 2012/0182677 | A1 | 7/2012 | Seo |
| 2012/0201104 | A1 * | 8/2012 | Amenduni Gresele ........... G04G 17/06 368/239 |
| 2012/0223593 | A1 | 9/2012 | Kamata |
| 2012/0244408 | A1 | 9/2012 | Huang et al. |
| 2013/0044215 | A1 | 2/2013 | Rothkopf et al. |
| 2013/0054061 | A1 | 2/2013 | Nishimoto |
| 2013/0083496 | A1 | 4/2013 | Franklin et al. |
| 2013/0154970 | A1 | 6/2013 | Seo et al. |
| 2013/0178248 | A1 * | 7/2013 | Kim ............... G06F 1/1652 455/566 |
| 2013/0181955 | A1 | 7/2013 | Okamoto et al. |
| 2013/0214324 | A1 | 8/2013 | Takayama et al. |
| 2013/0222270 | A1 * | 8/2013 | Winkler .......... H04M 1/0283 345/173 |
| 2013/0224562 | A1 | 8/2013 | Momo |
| 2013/0252065 | A1 | 9/2013 | Ueda |
| 2013/0262298 | A1 | 10/2013 | Morley |
| 2013/0314346 | A1 | 11/2013 | Yamazaki et al. |
| 2014/0057145 | A1 * | 2/2014 | Goldstein ......... H01M 10/613 429/71 |
| 2014/0062892 | A1 * | 3/2014 | Dickinson ......... G06F 1/1643 345/173 |
| 2014/0072864 | A1 * | 3/2014 | Suzuta ........... H01M 50/183 429/176 |
| 2014/0193710 | A1 * | 7/2014 | Hasegawa ......... H01M 50/172 429/211 |
| 2015/0325822 | A1 * | 11/2015 | Ichikawa .......... H01M 50/183 429/185 |
| 2017/0047358 | A1 | 2/2017 | Takayama et al. |
| 2017/0139532 | A1 | 5/2017 | Franklin et al. |

FOREIGN PATENT DOCUMENTS

| | | |
|---|---|---|
| CN | 001828778 A | 9/2006 |
| CN | 100380253 C | 4/2008 |
| EP | 1137088 A | 9/2001 |
| EP | 1180806 A | 2/2002 |
| EP | 143941 | 7/2004 |
| EP | 1909253 A | 4/2008 |
| EP | 1927904 A | 6/2008 |
| EP | 2631962 A | 8/2013 |
| JP | 2000-285904 A | 10/2000 |
| JP | 2001-052762 A | 2/2001 |
| JP | 2002-063938 A | 2/2002 |
| JP | 2002-528811 | 9/2002 |
| JP | 2003-174153 A | 6/2003 |
| JP | 2003-330384 A | 11/2003 |
| JP | 2004-240412 A | 8/2004 |
| JP | 2004-253472 A | 9/2004 |
| JP | 2005-250442 A | 9/2005 |
| JP | 2005-527066 | 9/2005 |
| JP | 2008-096543 A | 4/2008 |
| JP | 2008-139164 A | 6/2008 |
| JP | 2010-213498 A | 9/2010 |
| JP | 2010-282181 A | 12/2010 |
| JP | 2010-282183 A | 12/2010 |
| JP | 2011-060576 A | 3/2011 |
| JP | 5555380 | 7/2014 |
| KR | 10-0756203 | 9/2007 |
| KR | 2012-0100761 A | 9/2012 |
| TW | 564471 | 12/2003 |
| TW | I269454 | 12/2006 |
| WO | WO-2000/025193 | 5/2000 |
| WO | WO-2003/041206 | 5/2003 |
| WO | WO-2013/031148 | 3/2013 |
| WO | WO-2013/048925 | 4/2013 |

OTHER PUBLICATIONS

Written Opinion (Application No. PCT/JP2014/068654) Dated Nov. 4, 2014.
German Office Action (Application No. 112014005589.1) Dated Apr. 28, 2017.
Taiwanese Office Action (Application No. 103123933) Dated May 11, 2018.
Chinese Office Action (Application No. 201911098956.9) Dated Dec. 11, 2020.

* cited by examiner

FIG. 10A
FIG. 10C
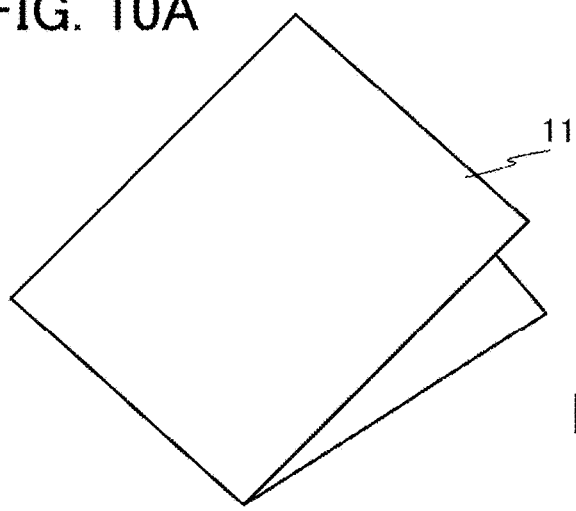
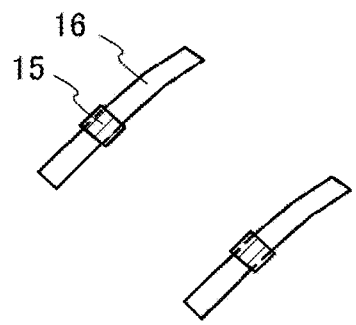
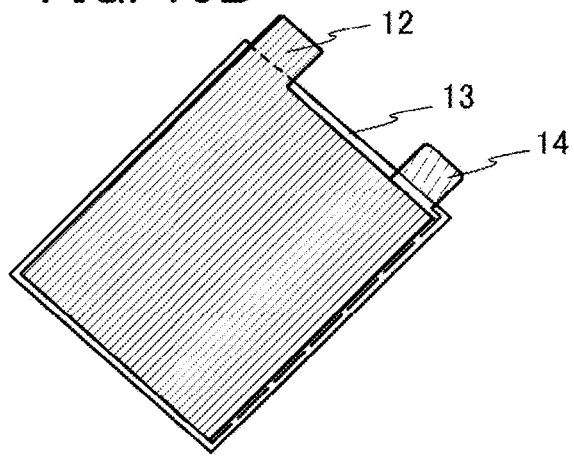
FIG. 10B
FIG. 10D
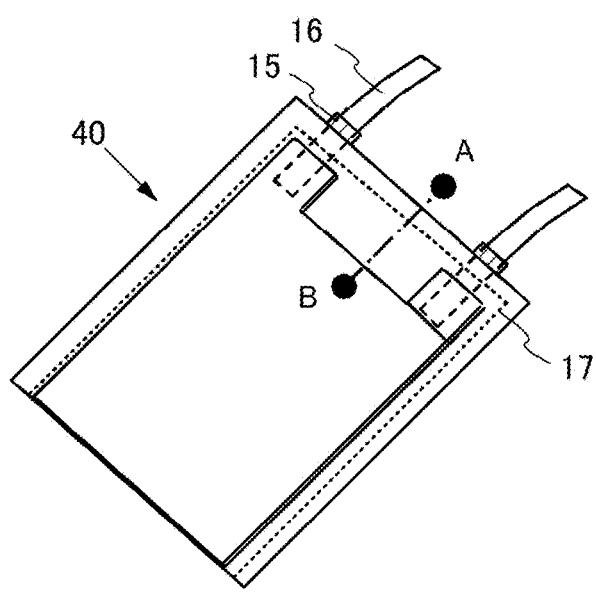
FIG. 10F
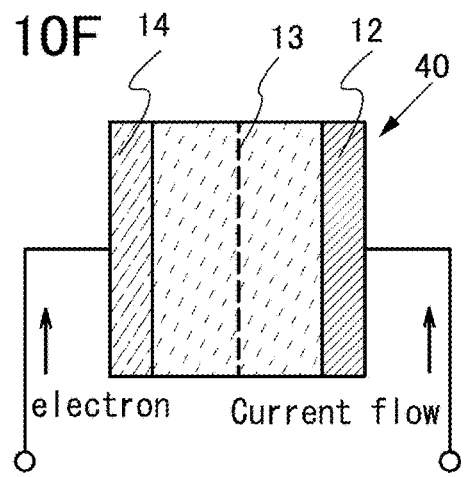
FIG. 10E
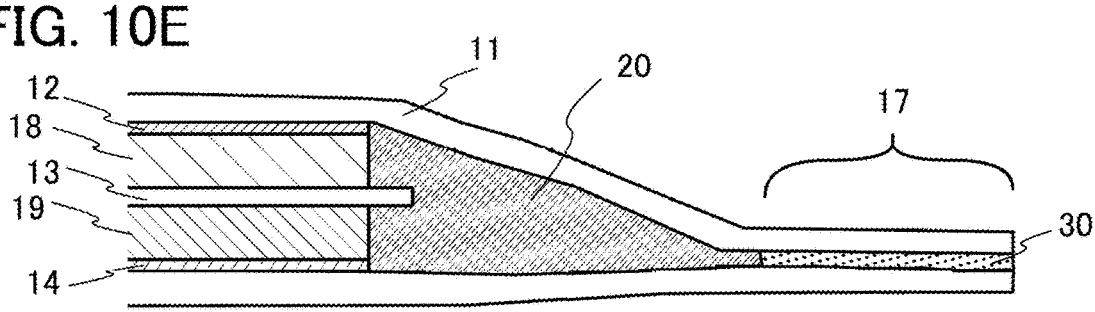

ELECTRONIC DEVICE

TECHNICAL FIELD

The present invention relates to electronic devices.

Note that electronic devices in this specification generally mean devices including secondary batteries, and electro-optical devices including secondary batteries, information terminal devices including secondary batteries, and the like are all electronic devices.

BACKGROUND ART

Display devices used while being worn on human bodies, such as display devices mounted on heads, have recently been developed and are referred to as head-mounted displays or wearable displays. It is desired that not only display devices but also electronic devices used while being worn on human bodies, such as hearing aids, have a light weight and a small size.

Along with a decrease in weight of electronic devices, it is demanded that batteries for supplying power to electronic devices also have a light weight and a small size.

Electronic books including flexible display devices are disclosed in Patent Documents 1 and 2.

PATENT DOCUMENTS

[Patent Document 1] Japanese Published Patent Application No. 2010-282181
[Patent Document 2] Japanese Published Patent Application No. 2010-282183

DISCLOSURE OF INVENTION

In order that a user can comfortably wear a display device used while being worn on a human body, the display device needs to have a light weight and a small size, and in addition, the whole electronic device including a driver device for the display device and a power source needs to have a light weight.

An electronic device of a novel embodiment, specifically, an arm-worn electronic device used while being worn on an arm, is provided. An arm-worn secondary battery used while being worn on an arm is provided.

An arm-worn secondary battery is obtained, in which a structure body having a curved surface to be in contact with part of a human body is used as a support structure body and a flexible secondary battery is fixed to the support structure body along the curved surface. It is preferable that the secondary battery be thin so that the secondary battery is flexible, and specifically, it is preferable to use a secondary battery with an increased volume energy density and a small number of electrode layers. The term "a small number of electrode layers" means a small number of stacked electrode pairs each including a positive electrode and a negative electrode, or a small number of windings in a wound battery. It is preferable that the arm-worn secondary battery have a small maximum thickness of 1 cm or less.

An embodiment of a band-like secondary battery to be worn on an arm is given as an example. In this embodiment, the secondary battery provided over the support structure body has an arch-like cross-sectional shape. In wearing the secondary battery, an end portion of the support structure body bends; thus, an end portion of the secondary battery also bends. Although the end portion of the secondary battery bends, since the secondary battery has flexibility, an exterior body of the secondary battery is not damaged and the secondary battery can retain battery performance.

A structure disclosed in this specification is an electronic device which includes a structure body having a curved surface and a flexible secondary battery being in contact with at least part of the curved surface of the structure body and including a film as an exterior body, and which is worn such that the curved surface of the structure body is in contact with a user's arm.

The flexible secondary battery includes the film as the exterior body and can change its shape along a curved surface portion of the structure body. In a region surrounded by the exterior body, a positive electrode, a negative electrode, and an electrolytic solution are provided. It is particularly preferable to use, as the secondary battery, a lithium-ion secondary battery which achieves a high energy density and therefore has a light weight and a small size.

In the above structure, the structure body is to be in contact with an arm and the flexible secondary battery is provided over the structure body. However, the present invention is not particularly limited to this example, and the flexible secondary battery may be provided between the structure body and the arm. A structure in that case is an electronic device which includes a structure body having a curved surface and a flexible secondary battery being in contact with at least part of the curved surface of the structure body and including a film as an exterior body, and which is worn such that the film is in contact with a user's arm.

In the above structure, a display portion may also be provided. A structure in that case is an electronic device which includes a structure body having a curved surface, a flexible secondary battery including a film as an exterior body over the curved surface of the structure body, and a display portion including a plurality of display elements between a pair of films over the secondary battery. The plurality of display elements and the secondary battery overlap with each other at least partly.

The larger the area where the plurality of display elements and the secondary battery overlap with each other is, the warmer the secondary battery can be made by use of heat generated by the display elements. Lithium-ion secondary batteries result in particularly poor performance at low temperatures in cold climates; thus, it is important to warm the secondary battery. Since the electronic device is worn on an arm and the secondary battery is located between the arm and the display elements, the secondary battery can be warmed efficiently from both front and back surface sides of the secondary battery. Furthermore, a highly heat conductive material may be used as a material of the structure body to effectively warm the secondary battery.

Alternatively, the secondary battery may be in contact with an arm, and a structure in that case is an electronic device which includes a structure body having a curved surface and a flexible secondary battery being in contact with at least part of the curved surface of the structure body and including a film as an exterior body, and which is worn such that the film is in contact with a user's arm. By contact with the user's arm, the secondary battery can be warmed.

In each of the above structures, one of the pair of films, between which the display portion including the plurality of display elements is located, on the side closer to the structure body may be a metal film such as a stainless steel film.

In each of the above structures, the display portion is preferably an active-matrix display device in which a plurality of display elements are arranged in a matrix. As the display elements, organic light-emitting elements, electronic ink, or the like can be used, and organic light-emitting elements are particularly preferable because they are as thin as, or thinner than, 3 mm and are lightweight.

When the display portion of the arm-worn electronic device is used together with a display portion of a conventional portable information terminal, the display portion of the arm-worn electronic device may be used as a sub-display.

In addition to the display device, each of the above structures may include another semiconductor circuit, e.g., a control circuit for preventing overcharge, an imaging element, a sensor such as a gyroscope sensor or an acceleration sensor, a touch panel, or the like. For example, when an imaging element is included in addition to the display device, a taken image can be displayed on the display device. When a sensor such as a gyroscope sensor or an acceleration sensor is included, the arm-worn electronic device can be powered on or off depending on the orientation or movement thereof to reduce power consumption. When a touch panel is included, the electronic device can be operated or information can be input by touching a predetermined position of the touch panel. When a memory and a CPU are included in addition to the display device in the above structure, a wearable computer can be obtained.

Furthermore, an antenna may be provided, and a structure in that case is an electronic device which includes a structure body having a curved surface, a flexible secondary battery being in contact with at least part of the curved surface of the structure body and including a film as an exterior body, and an antenna electrically connected to the secondary battery, and which is worn such that the curved surface of the structure body is in contact with a user's arm.

With the antenna, the secondary battery can be charged without contact. By an electromagnetic induction method in which an antenna of a charger (primary coil) and the antenna of the electronic device (secondary coil) are magnetically coupled and a voltage is generated at the secondary coil with an alternating magnetic field generated from the primary coil, electric power is transmitted to the secondary coil side without contact. Through this mechanism, the secondary battery is charged. It is preferable that the antenna be provided in contact with the curved surface of the structure body; therefore, it is preferable that the antenna of the electronic device be provided over a flexible film.

The arm-worn secondary battery may be provided with an antenna for purposes other than contactless charging of the secondary battery. A memory may be further provided, and an antenna that enables electronic data transmission and reception or an antenna that enables display of position or time with a GPS function by obtaining positional information or GPS time may be provided.

An antenna and a transmission and reception circuit for use as an active tag may be provided so that the arm-worn secondary battery can function as an active tag. The term "active tag" means a wireless IC tag (RFID) that includes a battery and can conduct communication.

The arm-worn secondary battery can function as a spare secondary battery for supplying power to a portable information terminal. A portable information terminal such as a smartphone is carried around without being powered off to stand by for an incoming email or call. As time elapses, the amount of remaining battery power decreases, and the portable information terminal runs out of power. When the portable information terminal has various functions such as a camera and a sensor, it is difficult to decrease its weight, and the space for the secondary battery is small. Even when the performance of the secondary battery included in the portable information terminal is improved, secondary batteries inevitably deteriorate by repeated use, and the secondary battery with improved performance is very expensive.

It is needless to say that a secondary battery of the same kind as that included in the portable information terminal may be purchased as a spare secondary battery and may be carried around all the time. However, in terms of safety, many portable information terminals are designed such that secondary batteries cannot be freely replaced by users. A charging module used as a spare secondary battery for charging a portable information terminal is also commercially available; however, the charging module is as large as or larger than the portable information terminal, and is heavier than the portable information terminal and specifically weighs 150 g or more. A spare secondary battery needs to be carried in a user's pocket or bag all the time, and is difficult to carry when a user wears clothes without pockets or when a user cannot carry a bag.

When a user also has an arm-worn secondary battery used while being worn on an arm, this can be used as an auxiliary power source after the secondary battery of the portable information terminal runs out of power. When a user wears it on his/her arm, it is not necessary to carry a spare secondary battery in his/her pocket or bag, which is convenient. The arm-worn secondary battery worn on an arm has an attractive design. Since the display portion and the secondary battery overlap with each other, when an image is displayed on the display portion, the secondary battery is hidden or camouflaged. Thus, other people recognize the electronic device worn on an arm as an accessory, not a spare secondary battery, and do not feel strange. This is particularly favorable for women because women often wear clothes without pockets and they care about how they look.

When the arm-worn secondary battery includes a display portion capable of displaying full-color images, the arm-worn secondary battery can be referred to as an arm-worn digital photo frame. A user can choose favorite images (pictures etc.) to be displayed on the arm-worn secondary battery.

The arm-worn secondary battery used while being worn on an arm is lightweight and weighs less than 150 g, preferably 100 g or less, more preferably 50 g or less as a whole, depending on the capacity of the secondary battery. When the arm-worn secondary battery is used as an auxiliary power source, the power does not always need to be on. By keeping the power off, a decrease in remaining battery power can be suppressed.

When the secondary battery is intended to be mainly used as a spare secondary battery, the display portion does not need to be capable of displaying full-color images and may be capable of displaying monochrome or mono-color images and may be capable of displaying only the amount of remaining battery power.

In each of the above structures, a metal or a resin can be used for the support structure body. Alternatively, a metal may be mainly used and a resin may be partly used for the support structure body, or a resin may be mainly used and a metal may be partly used for the support structure body. As the metal, stainless steel, aluminum, a titanium alloy, or the like can be used. As the resin, an acrylic resin, a polyimide resin, or the like can be used. A natural material can be used as a material of the support structure body, and as the natural material, processed wood, stone, bone, leather, paper, or cloth can be used.

It is possible to provide an electronic device which has a small maximum thickness of 1 cm or less and a light weight of 50 g or less even when an arm-worn secondary battery is provided with a display portion. It is possible to provide an electronic device which can be worn on an arm and is suitable for being carried around without being held with either hand. The arm-worn secondary battery can display an image on its display portion and can also be used as an accessory.

BRIEF DESCRIPTION OF DRAWINGS

FIGS. 10A to 10F are perspective views and cross-sectional views illustrating one embodiment of the present invention.

BEST MODE FOR CARRYING OUT THE INVENTION

Embodiments of the present invention will be described in detail below with reference to drawings. However, the present invention is not limited to the description below, and it is easily understood by those skilled in the art that modes and details disclosed herein can be modified in various ways. Further, the present invention is not construed as being limited to description of the embodiments.

Embodiment 1

Figure 1A:
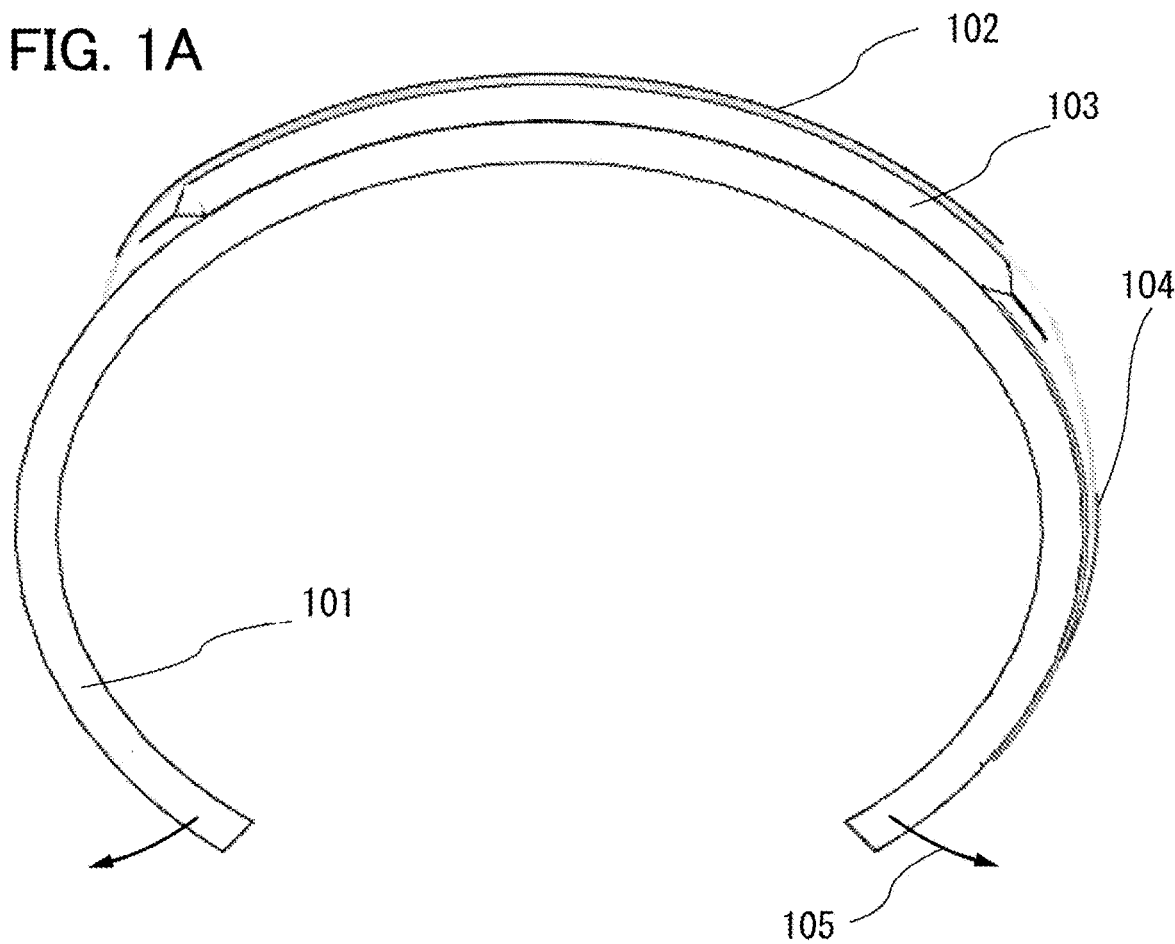
FIGS. 1A and 1B are a cross-sectional view and a perspective view illustrating one embodiment of the present invention.
Figure 1B:
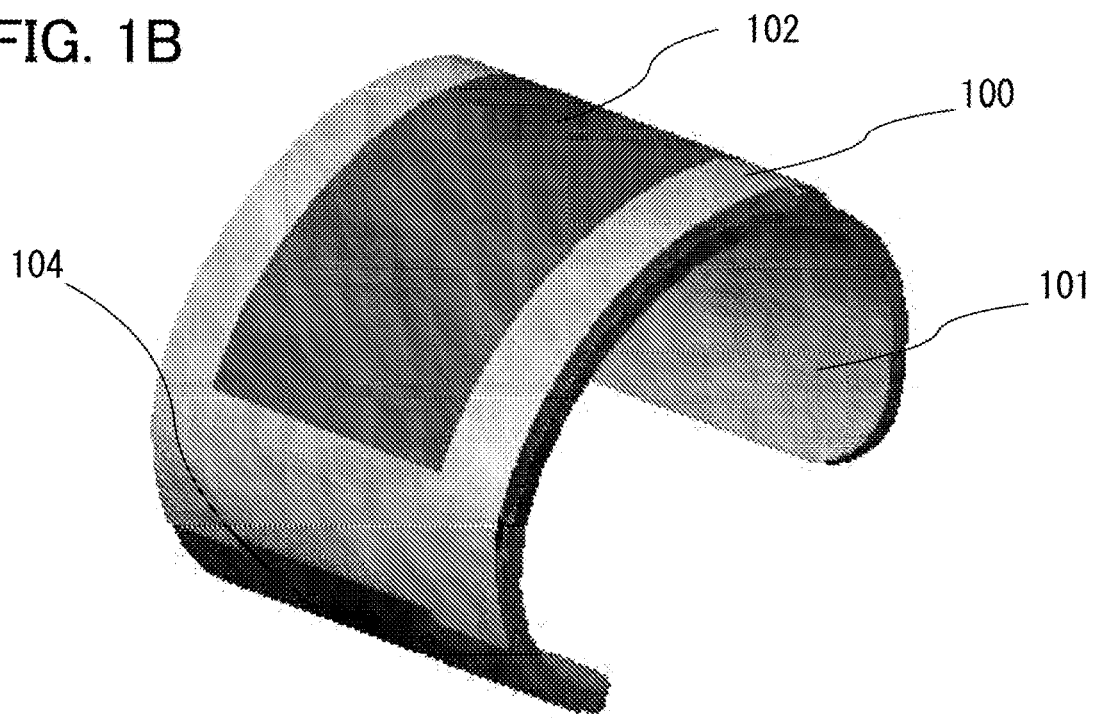

In this embodiment, an example of an electronic device in which an arm-worn secondary battery is provided with a display portion is described. FIG. 1A is a cross-sectional view of the electronic device, and FIG. 1B is a perspective view of the electronic device.

As illustrated in FIG. 1A, an electronic device 100 includes a flexible secondary battery 103 over a curved surface of a support structure body 101 and a display portion 102 over the secondary battery 103.

The support structure body 101 is in the form of a bracelet obtained by curving a band-like structure body. At least part of the support structure body 101 has flexibility and can be moved in the direction of arrows 105; thus, the electronic device can be put around a wrist. An end portion of the support structure body 101 illustrated in FIG. 1A is bendable, and a middle portion apart from the end portion hardly changes its shape. Therefore, the middle portion of the support structure body 101 maintains a curvature with which the secondary battery and the display portion are attached and fixed in fabrication; thus, the secondary battery 103 and the display portion 102 overlapping with the middle portion are hardly damaged even when the electronic device is repeatedly put on and taken off from an arm.

In the case where an active-matrix display device is provided as the display portion, the active-matrix display device includes at least a layer including transistors. The reliability of the layer including transistors is not easily decreased when the layer is only attached to and fixed to the curved surface of the support structure body 101. However, the reliability might be decreased when the layer including transistors is repeatedly bent in such a manner that the layer including transistors is curved toward one side into a concave shape, returned to a flat shape, and then curved toward the other side into a convex shape. Also in this regard, since the middle portion of the support structure body 101 illustrated in FIG. 1A hardly changes its shape, when the layer including transistors is fixed to the curved surface of the support structure body 101, the layer is curved toward only one side even if it is bent. In other words, the support structure body 101 functions as a protective member which prevents the display portion 102 and the secondary battery 103 from being curved excessively or from being twisted and deformed significantly.

As a material of the support structure body 101, a metal, a resin, a natural material, or the like can be used. The support structure body 101 preferably has a small thickness so as to be lightweight. A metal is preferably used as a material of the support structure body 101 because a metal has high impact resistance and high heat conductivity. A resin is preferably used as a material of the support structure body 101 because the resin can achieve a reduction in weight and does not cause metal allergy.

The shape of the electronic device illustrated in FIG. 1B is an example, and a belt or a clasp for fixing to a wrist may be provided. Alternatively, the electronic device may be in the form of a ring or a cylinder tube so as to surround a wrist.

Although the example of the electronic device to be worn on an arm such as a wrist (a lower arm including a wrist) or an upper arm is described, the position is not particularly limited, and the electronic device may be worn on any part of a human body such as a waist or an ankle. In the case where the electronic device is worn on an ankle, the electronic device may be manufactured to have a shape different from that illustrated in FIGS. 1A and 1B and have a size to fit an ankle shape. In the case where the electronic device is worn on a waist, the electronic device may be manufactured in a size to be wrapped around a waist like a belt.

An example of a method for manufacturing the electronic device 100 is described below.

First, the support structure body 101 is prepared. A stainless steel material whose region with a large radius of curvature in a cross-section does not change its shape and whose end portion is bendable is used for the support structure body 101. The stainless steel material serves as a protective material which prevents the display portion 102 and the secondary battery 103 from being curved excessively or from being twisted and deformed significantly. The stainless steel material only allows a change into a certain shape, i.e., bending in one direction, in putting the electronic device on an arm, which improves the reliability.

Next, the secondary battery 103 to be attached to the region with a large radius of curvature of the support structure body 101 is prepared.

The secondary battery 103 is not particularly limited as long as it is a lithium-ion secondary battery and is flexible. The flexible secondary battery includes a thin flexible film as an exterior body and can change its shape along a curved surface portion of the region with a large radius of curvature of the support structure body 101.

Figure 2A:
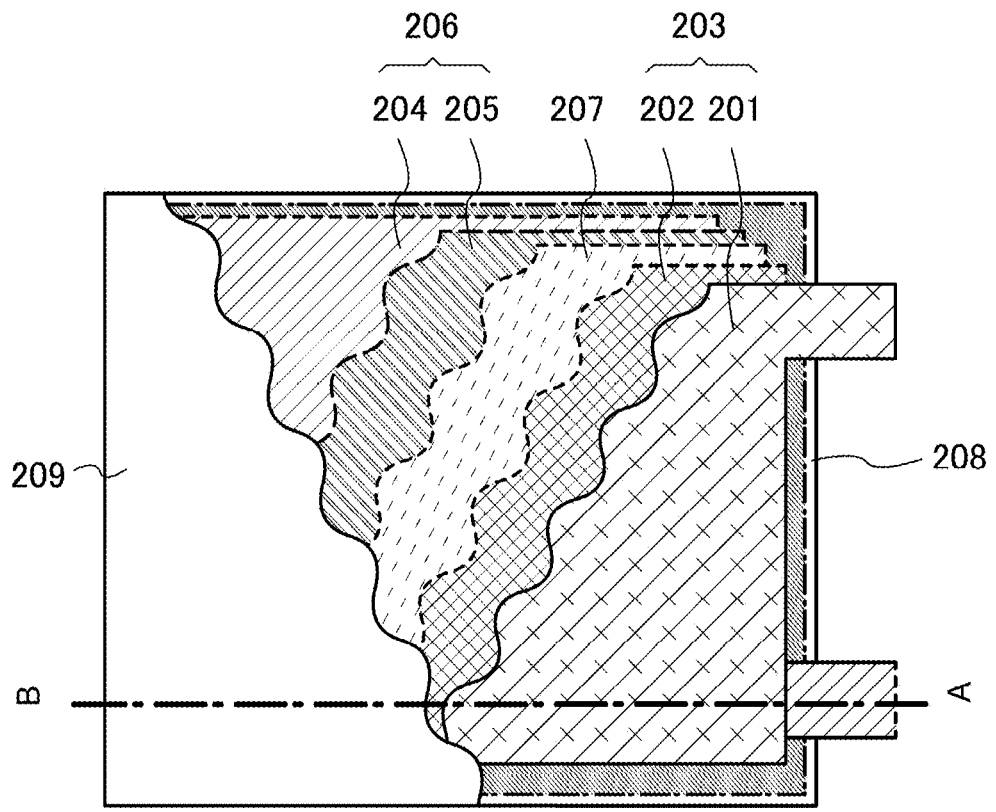
FIGS. 2A and 2B are a top view and a cross-sectional view illustrating one embodiment of the present invention.
Figure 2B:
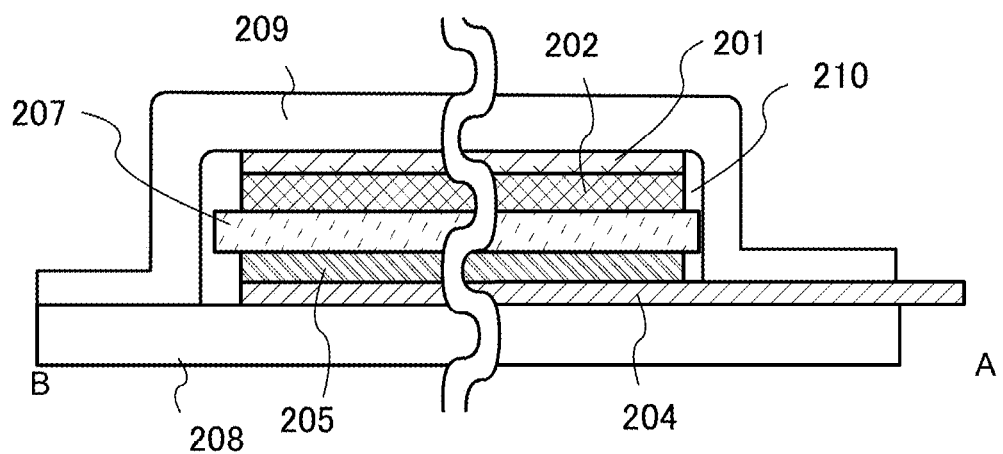

In this embodiment, an example in which a laminated secondary battery is used as the flexible secondary battery is described. FIG. 2A illustrates a top view of the laminated secondary battery. FIG. 2B is a schematic cross-sectional view taken along a dashed-dotted line A-B in FIG. 2A.

A secondary battery used is fabricated in such a manner that a sheet-like positive electrode 203, a separator 207, and a sheet-like negative electrode 206 are stacked, the other region is filled with an electrolytic solution 210, and these components are enclosed by an exterior body made of one or two films. Note that the positive electrode 203 includes a positive electrode current collector 201 and a positive electrode active material layer 202. The negative electrode 206 includes a negative electrode current collector 204 and a negative electrode active material layer 205.

The positive electrode current collector 201 and the negative electrode current collector 204 can each be formed using a highly conductive material which is not alloyed with a carrier ion of lithium or the like, such as a metal typified by stainless steel, gold, platinum, zinc, iron, nickel, copper, aluminum, titanium, or tantalum or an alloy thereof. Alternatively, an aluminum alloy to which an element which improves heat resistance, such as silicon, titanium, neodymium, scandium, or molybdenum, is added can be used. Still alternatively, a metal element which forms silicide by reacting with silicon can be used. Examples of the metal element which forms silicide by reacting with silicon include zirconium, titanium, hafnium, vanadium, niobium, tantalum, chromium, molybdenum, tungsten, cobalt, nickel, and the like. The positive electrode current collector 201 and the negative electrode current collector 204 can each have a foil-like shape, a plate-like shape (sheet-like shape), a net-like shape, a cylindrical shape, a coil shape, a punching-metal shape, an expanded-metal shape, or the like as appropriate. The positive electrode current collector 201 and the negative electrode current collector 204 each preferably have a thickness greater than or equal to 10 μm and less than or equal to 30 μm.

For the positive electrode active material layer 202, a material into and from which lithium ions can be inserted and extracted can be used. For example, a lithium-containing material with an olivine crystal structure, a layered rock-salt crystal structure, and a spinel crystal structure can be used. As the positive electrode active material, a compound such as $LiFeO_2$, $LiCoO_2$, $LiNiO_2$, $LiMn_2O_4$, $V_2O_5$, $Cr_2O_5$, and $MnO_2$ can be used.

Typical examples of the lithium-containing material with an olivine crystal structure (represented by a general formula, $LiMPO_4$ (M is one or more of Fe(II), Mn(II), Co(II), and Ni(II)), are $LiFePO_4$, $LiNiPO_4$, $LiCoPO_4$, $LiMnPO_4$, $LiFe_aNi_bPO_4$, $LiFe_aCo_bPO_4$, $LiFe_aMn_bPO_4$, $LiNi_aCo_bPO_4$, $LiNi_aMn_bPO_4$ (a+b≤1, 0<a<1, and 0<b<1), $LiFe_cNi_dCo_ePO_4$, $LiFe_cNi_dMn_ePO_4$, $LiNi_cCo_dMn_ePO_4$ (c+d+e≤1, 0<c<1, 0<d<1, and 0<e<1), and $LiFe_fNi_gCo_hMn_iPO_4$ (f+g+h+i≤1, 0<f<1, 0<g<1, 0<h<1, and 0<i<1).

$LiFePO_4$ is particularly preferable because it properly has properties necessary for the positive electrode active material, such as safety, stability, high capacity density, high potential, and the existence of lithium ions which can be extracted in initial oxidation (charging).

Examples of the lithium-containing material with a layered rock-salt crystal structure include lithium cobalt oxide ($LiCoO_2$); $LiNiO_2$; $LiMnO_2$; $Li_2MnO_3$; an NiCo-based lithium-containing material (a general formula thereof is $LiNi_xCo_{1-x}O_2$ (0<x<1)) such as or $LiNi_{0.8}Co_{0.2}O_2$; an NiMn-based lithium-containing material (a general formula thereof is $LiNi_xMn_{1-x}O_2$ (0<x<1)) such as $LiNi_{0.5}Mn_{0.5}O_2$; and an NiMnCo-based lithium-containing material (also referred to as NMC, and a general formula thereof is $LiNi_xMn_yCo_{1-x-y}O_2$ (x>0, y>0, x+y<1)) such as $LiNi_{1/3}Mn_{1/3}Co_{1/3}O_2$. Moreover, the examples further include $Li(Ni_{0.8}Co_{0.15}Al_{0.05})O_2$ and $Li_2MnO_3$—$LiMO_2$ (M=Co, Ni, or Mn).

Examples of the lithium-containing material with a spinel crystal structure include $LiMn_2O_4$, $Li_{1+x}Mn_{2-x}O_4$, $Li(MnAl)_2O_4$, and $LiMn_{1.5}Ni_{0.5}O_4$.

It is preferable to add a small amount of lithium nickel oxide ($LiNiO_2$ or $LiNi_{1-x}MO_2$ (M=Co or Al, for example)) to a lithium-containing material with a spinel crystal structure which contains manganese such as $LiMn_2O_4$ because advantages such as minimization of the elution of manganese and the decomposition of an electrolytic solution can be obtained.

Alternatively, a lithium-containing material represented by a general formula, $Li_{(2-j)}MSiO_4$ (M is one or more of Fe(II), Mn(II), Co(II), and Ni(II), 0≤j≤2), can be used as the positive electrode active material. Typical examples of $Li_{(2-j)}MSiO_4$ (general formula) include lithium compounds such as $Li_{(2-j)}FeSiO_4$, $Li_{(2-j)}NiSiO_4$, $Li_{(2-j)}CoSiO_4$, $Li_{(2-j)}MnSiO_4$, $Li_{(2-j)}Fe_kNi_lSiO_4$, $Li_{(2-j)}Fe_kCo_lSiO_4$, $Li_{(2-j)}Fe_kMn_lSiO_4$, $Li_{(2-j)}Ni_kCo_lSiO_4$, $Li_{(2-j)}Ni_kMn_lSiO_4$ (k+l≤1, 0<k<1, and 0<l<1), $Li_{(2-j)}Fe_mNi_nCo_qSiO_4$, $Li_{(2-j)}Fe_mNi_nMn_qSiO_4$, $Li_{(2-j)}Ni_mCo_nMn_qSiO_4$ (m+n+q≤1, 0<m<1, 0<n<1, and 0<q<1), and $Li_{(2-j)}Fe_rNi_sCo_tMn_uSiO_4$ (r+s+t+u≤1, 0<r<1, 0<s<1, 0<t<1, and 0<u<1).

Still alternatively, a NASICON compound represented by a general formula, $A_xM_2(XO_4)_3$ (A=Li, Na, or Mg, M=Fe, Mn, Ti, V, Nb, or Al, and X=S, P, Mo, W, As, or Si), can be used as the positive electrode active material. Examples of the NASICON compound include $Fe_2(MnO_4)_3$, $Fe_2(SO_4)_3$, and $Li_3Fe_2(PO_4)_3$. Still further alternatively, a compound represented by a general formula, $Li_2MPO_4F$, $Li_2MP_2O_7$, or $Li_5MO_4$ (M=Fe or Mn), a perovskite fluoride such as $NaF_3$ or $FeF_3$, a metal chalcogenide (a sulfide, a selenide, or a telluride) such as $TiS_2$ or $MoS_2$, a lithium-containing material with an inverse spinel crystal structure such as $LiMVO_4$, a vanadium oxide-based (e.g., $V_2O_5$, $V_6O_{13}$, or $LiV_3O_8$), a manganese oxide-based, or an organic sulfur-based material can be used as the positive electrode active material, for example.

The positive electrode active material layer 202 may further include a binder for increasing adhesion of active materials, a conductive additive for increasing the conductivity of the positive electrode active material layer 202, and the like in addition to the above-described positive electrode active materials.

A material with which lithium can be dissolved and precipitated or a material into and from which lithium ions can be inserted and extracted can be used for the negative electrode active material layer 205; for example, a lithium metal, a carbon-based material, or an alloy-based material can be used.

The lithium metal is preferable because of its low redox potential (3.045 V lower than that of a standard hydrogen electrode) and high specific capacity per unit weight and per unit volume (3860 mAh/g and 2062 mAh/cm$^3$).

Examples of the carbon-based material include graphite, graphitizing carbon (soft carbon), non-graphitizing carbon (hard carbon), a carbon nanotube, graphene, carbon black, and the like.

Examples of the graphite include artificial graphite such as meso-carbon microbeads (MCMB), coke-based artificial graphite, or pitch-based artificial graphite and natural graphite such as spherical natural graphite.

Graphite has a low potential substantially equal to that of a lithium metal (0.1 V to 0.3 V vs. Li/Li$^+$) when lithium ions are intercalated into the graphite (while a lithium-graphite intercalation compound is formed). For this reason, a lithium-ion secondary battery can have a high operating voltage. In addition, graphite is preferable because of its advantages such as relatively high capacity per unit volume, small volume expansion, low cost, and safety greater than that of a lithium metal.

For the negative electrode active material, an alloy-based material which enables charge-discharge reactions by an alloying reaction and a dealloying reaction with lithium can be used. In the case where carrier ions are lithium ions, a material containing at least one of Mg, Ca, Al, Si, Ge, Sn, Pb, Sb, Bi, Ag, Au, Zn, Cd, In, Ga, and the like can be used as an alloy-based material, for example. Such elements have higher capacity than carbon. In particular, silicon has a significantly high theoretical capacity of 4200 mAh/g. For this reason, silicon is preferably used for the negative electrode active material. Examples of the alloy-based material using such elements include SiO, $Mg_2Si$, $Mg_2Ge$, SnO, $SnO_2$, $Mg_2Sn$, $SnS_2$, $V_2Sn_3$, $FeSn_2$, $CoSn_2$, $Ni_3Sn_2$, $Cu_6Sn_5$, $Ag_3Sn$, $Ag_3Sb$, $Ni_2MnSb$, $CeSb_3$, $LaSn_3$, $La_3Co_2Sn_7$, $CoSb_3$, InSb, SbSn, and the like. Note that SiO refers to the powder of a silicon oxide including a silicon-rich portion and can also be referred to as $SiO_y$ (2>y>0). Examples of SiO include a material containing one or more of $Si_2O_3$, $Si_3O_4$, and $Si_2O$ and a mixture of Si powder and silicon dioxide ($SiO_2$). Furthermore, SiO may contain another element (e.g., carbon, nitrogen, iron, aluminum, copper, titanium, calcium, and manganese). In other words, SiO refers to a colored material containing two or more of single crystal silicon, amorphous silicon, polycrystal silicon, $Si_2O_3$, $Si_3O_4$, $Si_2O$, and $SiO_2$. Thus, SiO can be distinguished from $SiO_x$ (x is 2 or more), which is clear and colorless or white. Note that in the case where a secondary battery is fabricated using SiO as a material thereof and the SiO is oxidized because of repeated charge and discharge cycles, SiO is changed into $SiO_2$ in some cases.

Alternatively, for the negative electrode active material, an oxide such as titanium dioxide ($TiO_2$), lithium titanium oxide ($Li_4Ti_5O_{12}$), lithium-graphite intercalation compound ($Li_xC_6$), niobium pentoxide ($Nb_2O_5$), tungsten oxide ($WO_2$), or molybdenum oxide ($MoO_2$) can be used.

Still alternatively, for the negative electrode active material, $Li_{3-x}M_xN$ (M=Co, Ni, or Cu) with a $Li_3N$ structure, which is a nitride containing lithium and a transition metal, can be used. For example, $Li_{2.6}Co_{0.4}N_3$ is preferable because of high charge and discharge capacity (900 mAh/g and 1890 mAh/cm$^3$).

A nitride containing lithium and a transition metal is preferably used, in which case lithium ions are contained in the negative electrode active material and thus the negative electrode active material can be used in combination with a material for a positive electrode active material which does not contain lithium ions, such as $V_2O_5$ or $Cr_3O_8$. In the case of using a material containing lithium ions as a positive electrode active material, the nitride containing lithium and a transition metal can be used for the negative electrode active material by extracting the lithium ions contained in the positive electrode active material in advance.

Alternatively, a material which causes a conversion reaction can be used for the negative electrode active material; for example, a transition metal oxide which does not cause an alloy reaction with lithium, such as cobalt oxide (CoO), nickel oxide (NiO), and iron oxide (FeO), may be used. Other examples of the material which causes a conversion reaction include oxides such as $Fe_2O_3$, CuO, $Cu_2O$, $RuO_2$, and $Cr_2O_3$, sulfides such as $CoS_{0.89}$, NiS, and CuS, nitrides such as $Zn_3N_2$, $Cu_3N$, and $Ge_3N_4$, phosphides such as $NiP_2$, $FeP_2$, and $CoP_3$, and fluorides such as $FeF_3$ and $BiF_3$. Note that any of the fluorides can be used as a positive electrode active material because of its high potential.

The negative electrode active material layer 205 may further include a binder for increasing adhesion of active materials, a conductive additive for increasing the conductivity of the negative electrode active material layer 205, and the like in addition to the above-described negative electrode active materials.

As an electrolyte in the electrolytic solution 210, a material which contains lithium ions serving as carrier ions is used. Typical examples of the electrolyte are lithium salts such as $LiPF_6$, $LiClO_4$, $Li(FSO_2)_2N$, $LiAsF_6$, $LiBF_4$, $LiCF_3SO_3$, $Li(CF_3SO_2)_2N$, and $Li(C_2F_5SO_2)_2N$. One of these electrolytes may be used alone, or two or more of them may be used in an appropriate combination and in an appropriate ratio. In order to stabilize a reaction product, a small amount (1 wt %) of vinylene carbonate (VC) may be added to the electrolytic solution so that the decomposition amount of the electrolytic solution is further reduced.

As a solvent of the electrolytic solution 210, a material in which carrier ions can transfer is used. As the solvent of the electrolytic solution, an aprotic organic solvent is preferably used. Typical examples of aprotic organic solvents include ethylene carbonate (EC), propylene carbonate, dimethyl carbonate, diethyl carbonate (DEC), γ-butyrolactone, acetonitrile, dimethoxyethane, tetrahydrofuran, and the like, and one or more of these materials can be used. When a gelled high-molecular material is used as the solvent of the electrolytic solution, safety against liquid leakage and the like is improved. Furthermore, the secondary battery can be thinner and more lightweight. Typical examples of gelled high-molecular materials include a silicone gel, an acrylic gel, an acrylonitrile gel, polyethylene oxide, polypropylene oxide, a fluorine-based polymer, and the like. Alternatively, the use of one or more of ionic liquids (room temperature molten salts) which have features of non-flammability and non-volatility as a solvent of the electrolytic solution can prevent the secondary battery from exploding or catching fire even when the secondary battery internally shorts out or the internal temperature increases owing to overcharging and others.

As the separator 207, an insulator such as cellulose (paper), polyethylene with pores, and polypropylene with pores can be used.

FIG. 2B illustrates an example in which the number of electrode layers is two (two layers of the positive electrode 203 and the negative electrode 206). In order that the area (size) of the secondary battery is decreased without change in capacity of the secondary battery, the secondary battery can be downsized by increasing the number of electrode layers to more than two. However, if the number of electrode layers exceeds 40, the secondary battery has a large thickness and might lose its flexibility. Therefore, the number of electrode layers is set to 40 or less, preferably 20 or less. In the case of double-sided coating by which both sides of the positive electrode current collector are coated with the positive electrode active material layer 202, or in the case of double-sided coating by which both sides of the negative electrode current collector 204 are coated with the negative electrode active material layer 205, the number of electrode layers can be decreased to 10 or less without change in capacity of the secondary battery.

The stacked layer including the sheet-like positive electrode 203, the separator 207, and the sheet-like negative electrode 206 is sealed by heat sealing.

In the secondary battery, a thin flexible film (such as a laminate film) is used as an exterior body. The laminate film refers to a stacked film of a base film and an adhesive synthetic resin film, or a stacked film of two or more kinds of films. For the base film, polyester such as PET or PBT, polyamide such as nylon 6 or nylon 66, an inorganic film formed by evaporation, or paper may be used. For the adhesive synthetic resin film, polyolefin such as PE or PP, an acrylic-based synthetic resin, an epoxy-based synthetic resin, or the like may be used. An object is laminated with the laminate film by thermocompression bonding using a laminating apparatus. Note that an anchor coat agent is preferably applied as pretreatment for the laminating step so that the adhesion between the laminate film and the object can be increased. As the anchor coat agent, an isocyanate-based material or the like may be used.

In this specification, heat sealing refers to sealing by thermocompression bonding, and means that an adhesive layer partly covering the base film or an outermost or innermost layer with a low melting point in the laminate film is melted by heat and attached by pressure.

The positive electrode current collector 201 and the negative electrode current collector 204 also serve as terminals for electrical contact with the outside. For this reason, the positive electrode current collector 201 and the negative electrode current collector 204 are provided so that part of the positive electrode current collector 201 and part of the negative electrode current collector 204 are exposed outside a film 208 and an exterior body 209 as illustrated in FIG. 2A. In the case where a larger number of electrode layers are stacked, a plurality of positive electrode current collectors 201 are electrically connected by ultrasonic welding, and a plurality of negative electrode current collectors 204 are electrically connected by ultrasonic welding. Note that in FIG. 2B, part of the negative electrode current collector 204 extends to the outside beyond the exterior body 209.

The laminated secondary battery obtained as described above is first attached to the region with a large radius of curvature of the support structure body 101 and then to the other region. By first attaching the secondary battery to the region with a large radius of curvature, damage to the secondary battery can be reduced during attachment to the support structure body 101.

Although FIG. 2A illustrates the example of sealing with the film 208 and the exterior body 209, the present invention is not particularly limited to this example, and a single film folded in half may be used as an exterior body. An example different from that in FIGS. 2A and 2B is illustrated in FIGS. 10A to 10F. A film 11 is folded in half so that two end portions overlap, and is sealed on three sides with an adhesive layer. A manufacturing method in this example is described below with reference to FIGS. 10A to 10F.

First, the film 11 is folded in half as illustrated in FIG. 10A. In addition, a positive electrode current collector 12, a separator 13, and a negative electrode current collector 14 which are components of a secondary battery and stacked as illustrated in FIG. 10B are prepared. Furthermore, two lead electrodes 16 with sealing layers 15 illustrated in FIG. 10C are prepared. The lead electrodes 16 are each also referred to as a lead terminal and provided in order to lead a positive electrode or a negative electrode of a secondary battery to the outside of an exterior film. Then, one of the lead electrodes is electrically connected to a protruding portion of the positive electrode current collector 12 by ultrasonic welding or the like. Aluminum is used as a material of the lead electrode connected to the protruding portion of the positive electrode current collector 12. The other lead electrode is electrically connected to a protruding portion of the negative electrode current collector 14 by ultrasonic welding or the like. Nickel-plated copper is used as a material of the lead electrode connected to the protruding portion of the negative electrode current collector 14. Then, two sides of the film 11 are sealed by thermocompression bonding, and one side is left open for introduction of an electrolytic solution. In thermocompression bonding, the sealing layers 15 provided over the lead electrodes are also melted, thereby fixing the lead electrodes and the film 11 to each other. After that, in a reduced-pressure atmosphere or an inert atmosphere, a desired amount of electrolytic solution is introduced to the inside of the film 11 in the form of a bag. Lastly, the side of the film which has not been subjected to thermocompression bonding and is left open is sealed by thermocompression bonding. In this manner, a secondary battery 40 illustrated in FIG. 10D can be manufactured. An edge region indicated by a dotted line in FIG. 10D is a thermocompression-bonded region 17. An example of a cross-section taken along a dashed-dotted line A-B in FIG. 10D is illustrated in FIG. 10E. As illustrated in FIG. 10E, the positive electrode current collector 12, a positive electrode active material layer 18, the separator 13, a negative electrode active material layer 19, and the negative electrode current collector 14 are stacked in this order and placed inside the folded film 11, an end portion is sealed with an adhesive layer 30, and the other space is provided with an electrolytic solution 20.

Here, a current flow in charging a secondary battery will be described with reference to FIG. 10F. When a secondary battery using lithium is regarded as a closed circuit, lithium ions transfer and a current flows in the same direction. Note that in the secondary battery using lithium, an anode and a cathode change places in charge and discharge, and an oxidation reaction and a reduction reaction occur on the corresponding sides; hence, an electrode with a high redox potential is called a positive electrode and an electrode with a low redox potential is called a negative electrode. For this reason, in this specification, the positive electrode is referred to as a "positive electrode" and the negative electrode is referred to as a "negative electrode" in all the cases where charge is performed, discharge is performed, a reverse pulse current is supplied, and a charging current is supplied. The use of the terms "anode" and "cathode" related to an oxidation reaction and a reduction reaction might cause confusion because the anode and the cathode change places at the time of charging and discharging. Thus, the terms "anode" and "cathode" are not used in this specification. If the term "anode" or "cathode" is used, it should be mentioned that the anode or the cathode is which of the one at the time of charging or the one at the time of discharging and corresponds to which of a positive electrode or a negative electrode.

Two terminals in FIG. 10F are connected to a charger, and the secondary battery 40 is charged. As the charge of the secondary battery 40 proceeds, a potential difference between electrodes increases. The positive direction in FIG. 10F is the direction in which a current flows from one terminal outside the secondary battery 40 to the positive electrode current collector 12, flows from the positive electrode current collector 12 to the negative electrode current collector 14 in the secondary battery 40, and flows from the negative electrode current collector 14 to the other terminal outside the secondary battery 40. In other words, a current flows in the direction of a flow of a charging current.

Next, a display module to be attached to the secondary battery 103 is prepared. The display module refers to a display panel provided with at least an FPC. The display module includes the display portion 102, an FPC 104, and a driver circuit and preferably further includes a converter for power feeding from the secondary battery 103.

In the display module, the display portion 102 is flexible and a display element is provided over a flexible film. The secondary battery 103 and the display portion 102 are preferably disposed so as to partly overlap with each other. When the secondary battery 103 and the display portion 102 are disposed so as to partly or entirely overlap with each other, the electrical path, i.e., the length of a wiring, from the secondary battery 103 to the display portion can be shortened, whereby power consumption can be reduced.

Examples of methods for manufacturing the display element over the flexible film include a method in which the display element is directly formed over the flexible film, a method in which a layer including the display element is formed over a rigid substrate such as a glass substrate, the substrate is removed by etching, polishing, or the like, and then the layer including the display element and the flexible film are attached to each other, a method in which a separation layer is provided over a rigid substrate such as a glass substrate, a layer including the display element is formed thereover, the rigid substrate and the layer including the display element are separated from each other using the separation layer, and then the layer including the display element and the flexible film are attached to each other, and the like.

In this embodiment, a manufacturing method which allows heat treatment to be performed at 400° C. or higher and which can improve the reliability of the display element, i.e., a technique in which a separation layer is provided over a rigid substrate such as a glass substrate as disclosed in Japanese Published Patent Application No. 2003-174153, is used so that the display portion 102 can be an active-matrix display device capable of displaying high-resolution images.

The technique disclosed in Japanese Published Patent Application No. 2003-174153 enables transistors including polysilicon in active layers or transistors including oxide semiconductor layers to be provided over a flexible substrate or film. These transistors are used as switching elements, and electroluminescent (EL) elements are provided.

In a common structure of the EL element, a layer including a light-emitting organic compound or inorganic compound (hereinafter referred to as a light-emitting layer) is provided between a pair of electrodes, and when a voltage is applied to the element, electrons and holes are each injected and transported from the pair of electrodes to the light-emitting layer. When those carriers (electrons and holes) recombine, an excited state of the light-emitting organic compound or inorganic compound is formed, and when the light-emitting organic compound or inorganic compound returns to a ground state, light is emitted.

Further, kinds of excited state that can be formed by an organic compound are a singlet excited state and a triplet excited state. Light emission in the case of a singlet excited state is referred to as fluorescence, and light emission in the case of a triplet excited state is referred to as phosphorescence.

Such a light-emitting element is usually formed of thin films which have an approximate thickness of submicrons to several microns. Therefore, they can be manufactured to be thin and light, which is a large advantage. Further, such light-emitting elements also have an advantage in that the period of time from when the carriers are injected until light is emitted is microseconds at the most, so they have a very high response speed. Moreover, because sufficient light emission can be obtained with a direct current voltage of approximately several to several tens of volts, power consumption is also relatively low.

EL elements have a wider viewing angle than that of liquid crystal elements and are preferable as display elements in the display portion 102 when a display region has a curved surface. In addition, EL elements are preferable as display elements in the display portion 102 in that unlike liquid crystal elements, EL elements do not require a backlight, which makes it possible to reduce power consumption, the number of components, and the total thickness.

Note that methods for manufacturing display elements over a flexible film are not limited to the method mentioned above (Japanese Published Patent Application No. 2003-174153). Methods and materials for manufacturing EL elements may be known methods and materials and are therefore not described here.

The display device used as the display portion 102 may only be capable of simply displaying single-color images or displaying numbers. Therefore, a passive-matrix display device may be used, in which case a display element may be manufactured over a flexible film using a method other than the technique disclosed in Japanese Published Patent Application No. 2003-174153.

The display module obtained by the above method is attached to the secondary battery 103, and the secondary battery 103 and the display portion 102 are electrically connected to each other, whereby the electronic device 100 illustrated in FIG. 1B is completed. Furthermore, a metal cover, a plastic cover, or a rubber cover may be provided over a portion other than the display portion 102 to improve the appearance of the electronic device 100.

In the case where the electronic device 100 is provided with the display portion, the screen size is not particularly limited as long as the display portion is of such a size that it can be disposed over the support structure body. For example, in the case where the electronic device is worn on an arm, the maximum screen size is the product of an arm girth of 23 cm and a wrist-to-elbow length because the girth of an adult arm near a wrist is 18 cm±5 cm. The wrist-to-elbow length of an adult is shorter than or equal to a feet (30.48 cm); thus, the maximum screen size of the display portion that can be disposed over the support structure body in the form of a cylinder tube in the electronic device 100 that is worn on an arm is 23 cm×30.48 cm. Note that the screen size here does not refer to the size in a curved state but refers to the size in a flat state. A plurality of display portions may be provided in one electronic device; for example, a second display portion smaller than a first display portion may be included in an electronic device. The dimension of the support structure body 101 is set larger than the screen size of the display portion. In the case of using EL elements, when the display portion is of such a screen size that it can be disposed over the support structure body, the sum of the weights of the display panel and the FPC can be more than or equal to 1 g and less than 10 g.

The thickness of the thinnest portion of the electronic device provided with the display portion (the thickness of the support structure body 101, the display portion 102, and the secondary battery 103 overlapping with each other) can be less than or equal to 5 mm. The thickness of the thickest portion of the electronic device, which is a portion where the display panel and the FPC are connected to each other, can be less than 1 cm.

The total weight of the electronic device 100 can be less than 100 g.

The electronic device 100 can be put on an arm because part of the support structure body can be moved in the direction of the arrows 105 illustrated in FIG. 1A. The electronic device 100 has a total weight less than 100 g, preferably less than or equal to 50 g and a small maximum thickness less than or equal to 1 cm; thus, a lightweight electronic device can be provided.

Figure 7A:
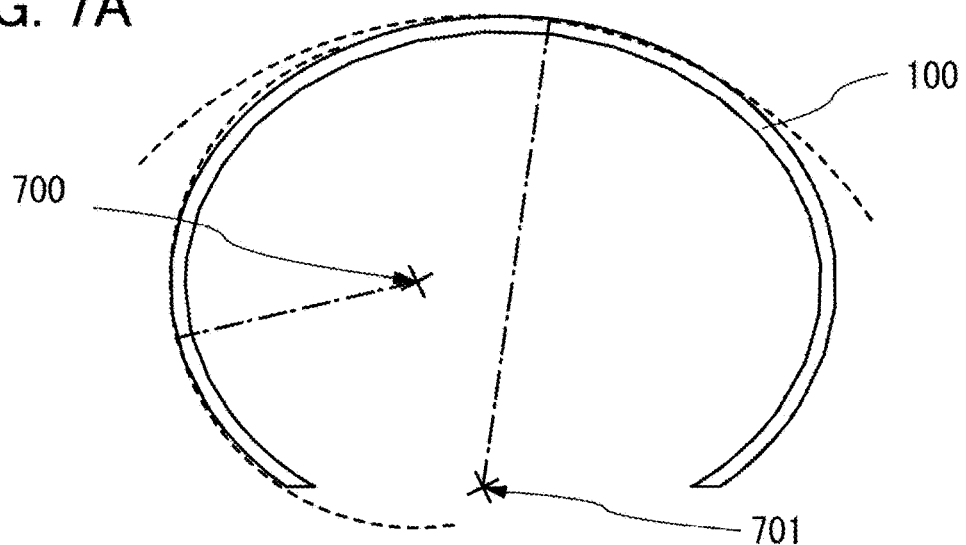
FIGS. 7A to 7C are a cross-sectional view, a bottom view, and a side view illustrating one embodiment of the present invention.

The electronic device 100 has a plurality of curved surfaces with different radii of curvature in a cross-section as illustrated in FIG. 7A. FIG. 7A illustrates a center 700 of curvature and a center 701 of curvature.

Figure 9A:
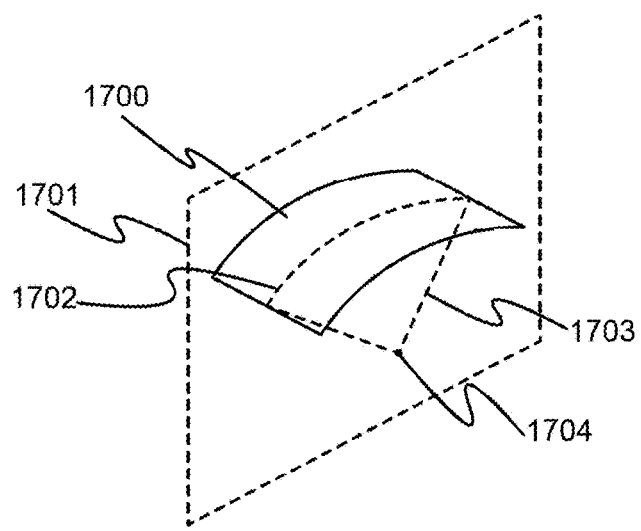
FIGS. 9A to 9C illustrate a radius of curvature of a surface.
Figure 9B:
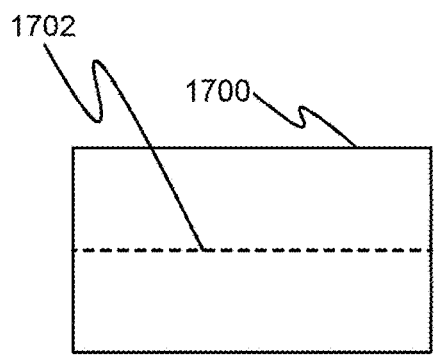
Figure 9C:
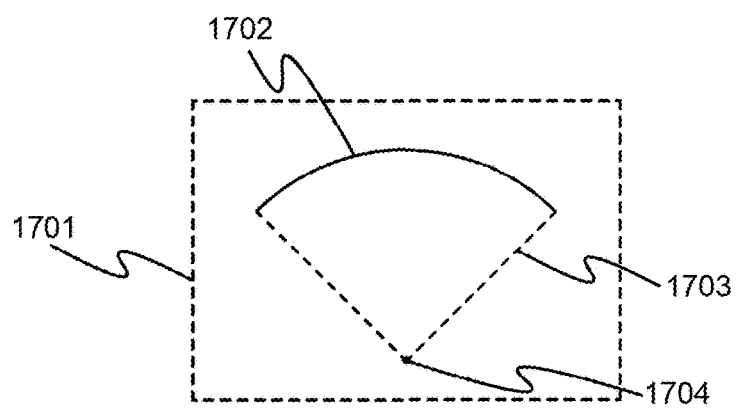

Description is given of the radius of curvature of a surface with reference to FIGS. 9A to 9C. In FIG. 9A, on a plane 1701 along which a curved surface 1700 is cut, part of a curve 1702 is approximate to an arc of a circle, and the radius of the circle is referred to as a radius 1703 of curvature and the center of the circle is referred to as a center 1704 of curvature. FIG. 9B is a top view of the curved surface 1700. FIG. 9C is a cross-sectional view of the curved surface 1700 taken along the plane 1701. When a curved surface is cut along a plane, the radius of curvature of a curve depends on along which plane the curved surface is cut. Here, the radius of curvature of a curved surface is defined as the radius of curvature of a curve on a plane along which the curved surface is cut such that the curve has the smallest radius of curvature.

Figure 8A:
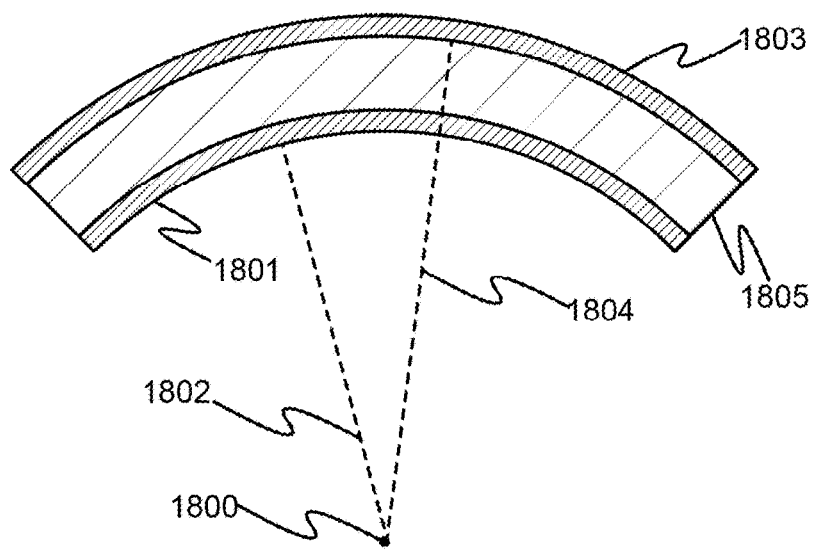
FIGS. 8A to 8C illustrate a center of curvature.
Figure 8B:
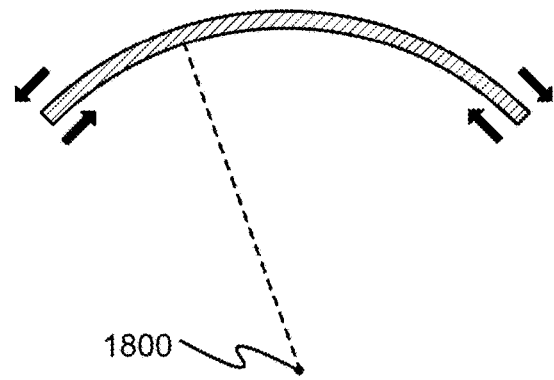

In the case of curving the electronic device 100 which has a lower arm contact surface (exposed back surface) of the exterior body on the inner side and a film surface (exposed front surface) of the display panel on the outer side, a radius 1802 of curvature of an exterior body 1801 (exposed back surface) on the side closer to a center 1800 of curvature of the secondary battery and in contact with a support structure body 1805 is smaller than a radius 1804 of curvature of a film 1803 on the side farther from the center 1800 of curvature (FIG. 8A). When the electronic device 100 is curved and has an arc-shaped cross section, compressive stress is applied to the exposed back surface of the exterior body on the side closer to the center 1800 of curvature, and tensile stress is applied to the exposed surface of the film on the side farther from the center 1800 of curvature (FIG. 8B). The electronic device 100 can change its shape such that the exterior body 1801 on the side closer to the center of curvature has a curvature radius greater than or equal to 10 mm, preferably greater than or equal to 30 mm.

Figure 8C:
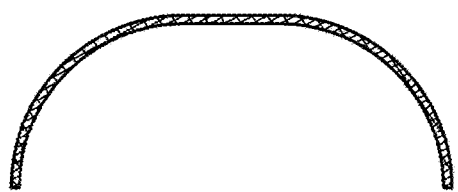

Note that the cross-sectional shape of the electronic device 100 is not limited to a simple arc shape, and the cross-section of a portion in contact with a wrist can have an arc shape; for example, a shape illustrated in FIG. 8C or the like can be used. When the curved surface of the secondary battery has a shape with a plurality of centers of curvature, the electronic device 100 can change its shape such that a curved surface with the smallest radius of curvature among radii of curvature with respect to the plurality of centers of curvature, which is a surface of the exterior body 1801 on the side closer to the center of curvature, has a curvature radius greater than or equal to 10 mm, preferably greater than or equal to 30 mm.

Figure 7B:
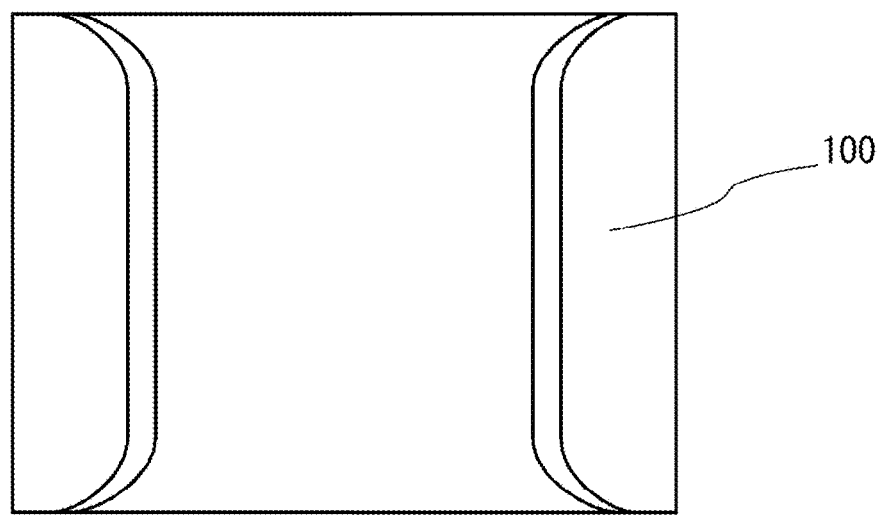
Figure 7C:
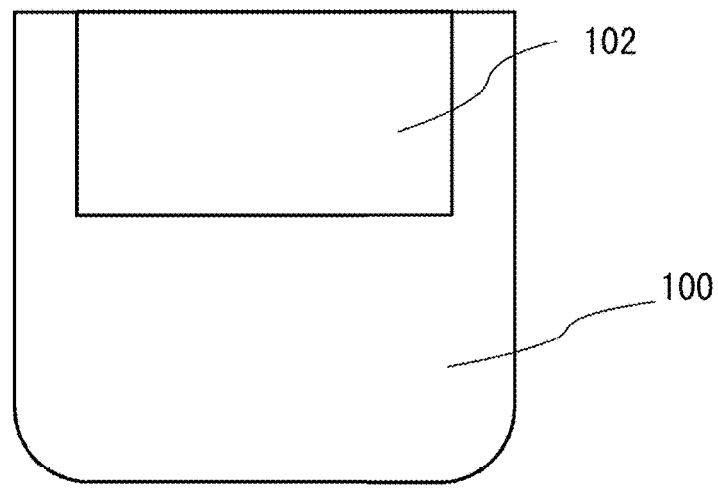

FIG. 7B illustrates a bottom view of the electronic device 100 which is seen from the exposed back surface side of the support structure body. FIG. 7C illustrates a side view of the electronic device 100.

Embodiment 2

In this embodiment, an example of a method for charging a secondary battery using an antenna is described.

Since an electronic device is to be in contact with part of a human body, it is preferable for safety that input and output terminals for charging or discharging a secondary battery be not exposed. In the case where the input and output terminals are exposed, the input and output terminals might short-circuit by water such as rain, or the input and output terminals might be in contact with a human body and cause an electric shock. The use of an antenna enables a structure in which the input and output terminals are not exposed on a surface of the electronic device.

Note that this embodiment is the same as Embodiment 1 except that an antenna and an RF power feed converter are provided; therefore, the other components are not described in detail here.

In accordance with Embodiment 1, a flexible secondary battery is fixed to a support structure body, and a display module is attached to the secondary battery. An RF power feed converter and an antenna which are electrically connected to the secondary battery are provided. The RF power feed converter is fixed so as to overlap with part of a display portion.

The RF power feed converter and the antenna weigh less than or equal to 10 g, and the total weight does not significantly differ from that in Embodiment 1.

Figure 3:
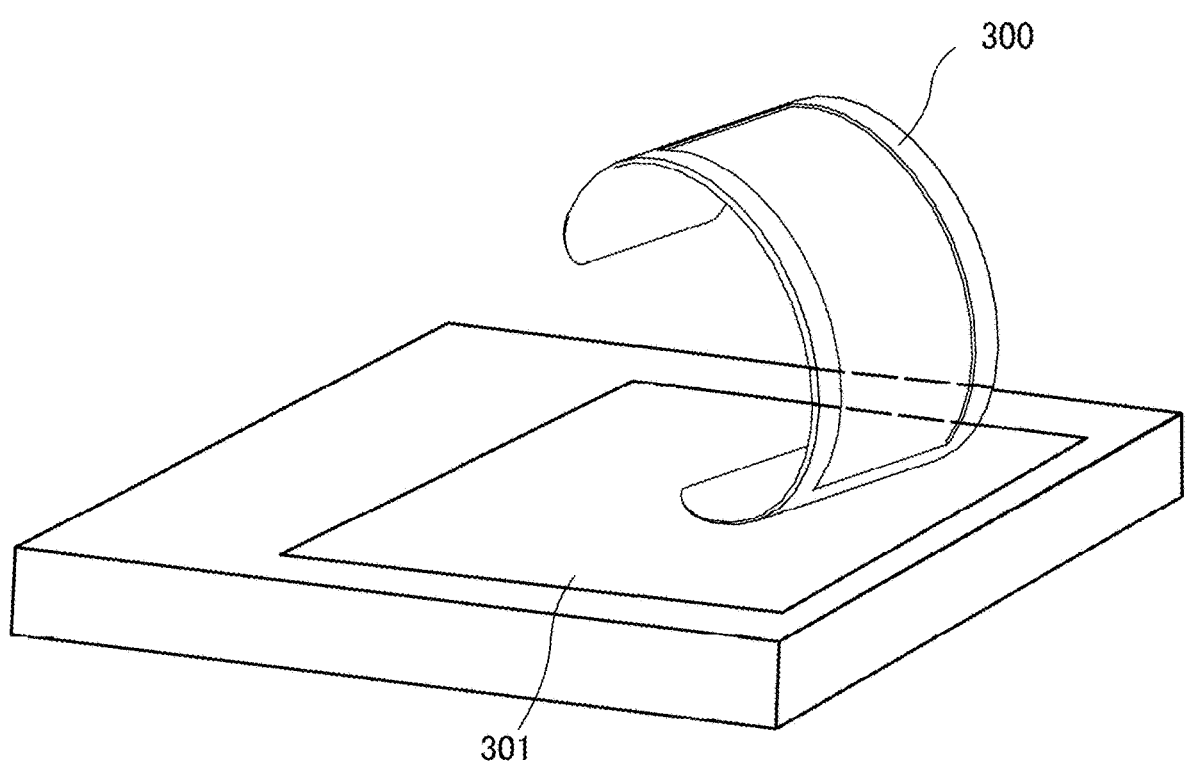
FIG. 3 is a perspective view illustrating one embodiment of the present invention.

FIG. 3 illustrates a schematic diagram of an electronic device 300 including an antenna (not illustrated) and a charger 301. When the electronic device 300 is disposed over the charger 301, electric power can be supplied from an antenna of the charger 301 to the electronic device 300 to charge a secondary battery of the electronic device 300.

Information such as the remaining amount or time to full charge can be displayed on a display portion of the electronic device 300.

This embodiment can be freely combined with Embodiment 1.

Embodiment 3

In this embodiment, an example of a structure for preventing the formation of wrinkles or the leakage of an electrolytic solution which might occur when a secondary battery is curved is described with reference to FIGS. 4A and 4B.

In Embodiment 1, the secondary battery is sealed with the laminate film, and the periphery is fixed in one portion (in the cross-sectional view). Thus, if the sealing is broken at any place when the secondary battery is bent repeatedly or subjected to impact, the electrolytic solution leaks from the inside. In the case where the laminate film is fixed in one portion, bending stress due to repeated bending of or impact on the secondary battery is concentrated in that portion, whereby the sealing cannot be maintained.

Figure 4A:
FIGS. 4A and 4B are cross-sectional views illustrating one embodiment of the present invention.

In view of this, in this embodiment, two films are fixed in two portions as illustrated in FIG. 4A. FIG. 4A illustrates a schematic cross-sectional view of a secondary battery 400 whose positive and negative electrodes are sealed with two films. By fixing in two portions, bending stress is relaxed and the sealing can be maintained.

Figure 4B:
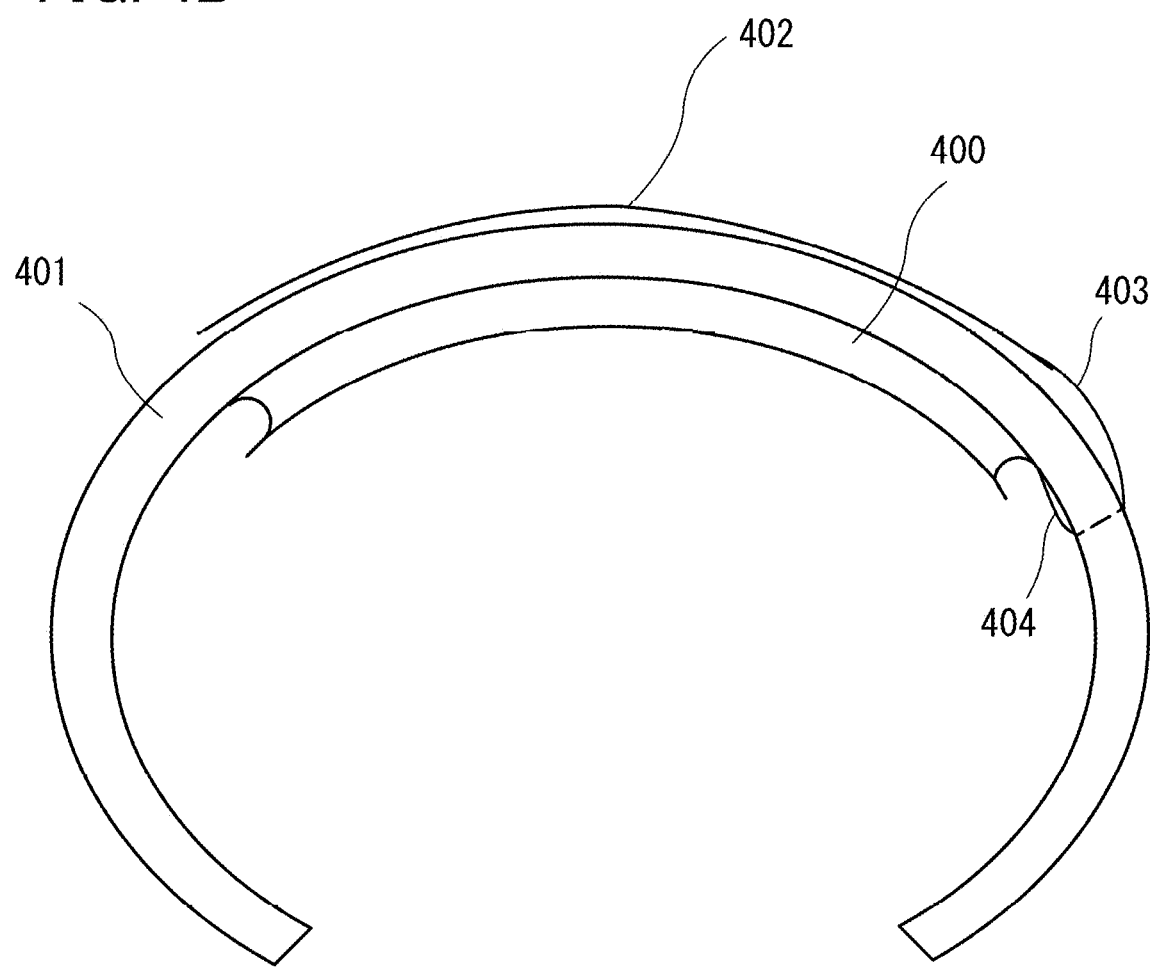

A structural example different from that in Embodiment 1 is illustrated in FIG. 4B.

FIG. 4B illustrates an example in which a display portion 402 is provided on the front surface side of a support structure body 401 and the secondary battery 400 is disposed on the back surface side.

In FIG. 4B, the support structure body 401 is provided with an opening, and an FPC 403 extending from the display portion 402 and an FPC 404 extending from the secondary battery are electrically connected to each other through the opening.

In this embodiment, the size of the opening provided in the support structure body 401 is not particularly limited, and as long as a certain degree of mechanical strength can be secured, the area of the opening may be larger than that of the display portion 402, and the display portion may be set in the opening. In that case, the secondary battery 400 and the display portion 402 may be in contact with each other. As the size of the opening increases, the weight of the support structure body decreases. Thus, the total weight can be decreased.

This embodiment can be freely combined with Embodiment 1.

Example 1

Figure 5:
FIG. 5 is a photograph showing one embodiment of the present invention.

FIG. 5 is a photograph of an electronic device which is manufactured in accordance with Embodiment 1 and is worn on an arm with an image displayed on a display portion.

The electronic device shown in FIG. 5 is 77 mm long, 60 mm wide, and 57 mm high, and the dimension is determined by a stainless steel support structure body. A display panel has an external size of 51.5 mm×92.15 mm, and the display region has a size of 42.12 mm×74.88 mm. The electronic device has a total weight of 40 g to 50 g, and the sum of the weights of the display panel and an FPC can be approximately 2 g. Note that the term "FPC" in this specification refers to a flexible printed wiring board, in which a plurality of metal foil (e.g., Cu, Ni, or Au) patterns are formed over a base member of a polyimide resin, an epoxy resin, or the like. An anisotropic conductive film (ACF) used for compression bonding is formed along a side of an end of the FPC so as to cross end portions of the plurality of arranged metal foil patterns. An external connection terminal of the display panel and the FPC are electrically connected to each other by compression bonding using the ACF provided over the FPC.

As a secondary battery, a laminated secondary battery is used, and as a positive electrode active material, lithium iron phosphate (LiFePO$_4$) is used. Lithium iron phosphate can improve the safety of the secondary battery.

Figure 6:
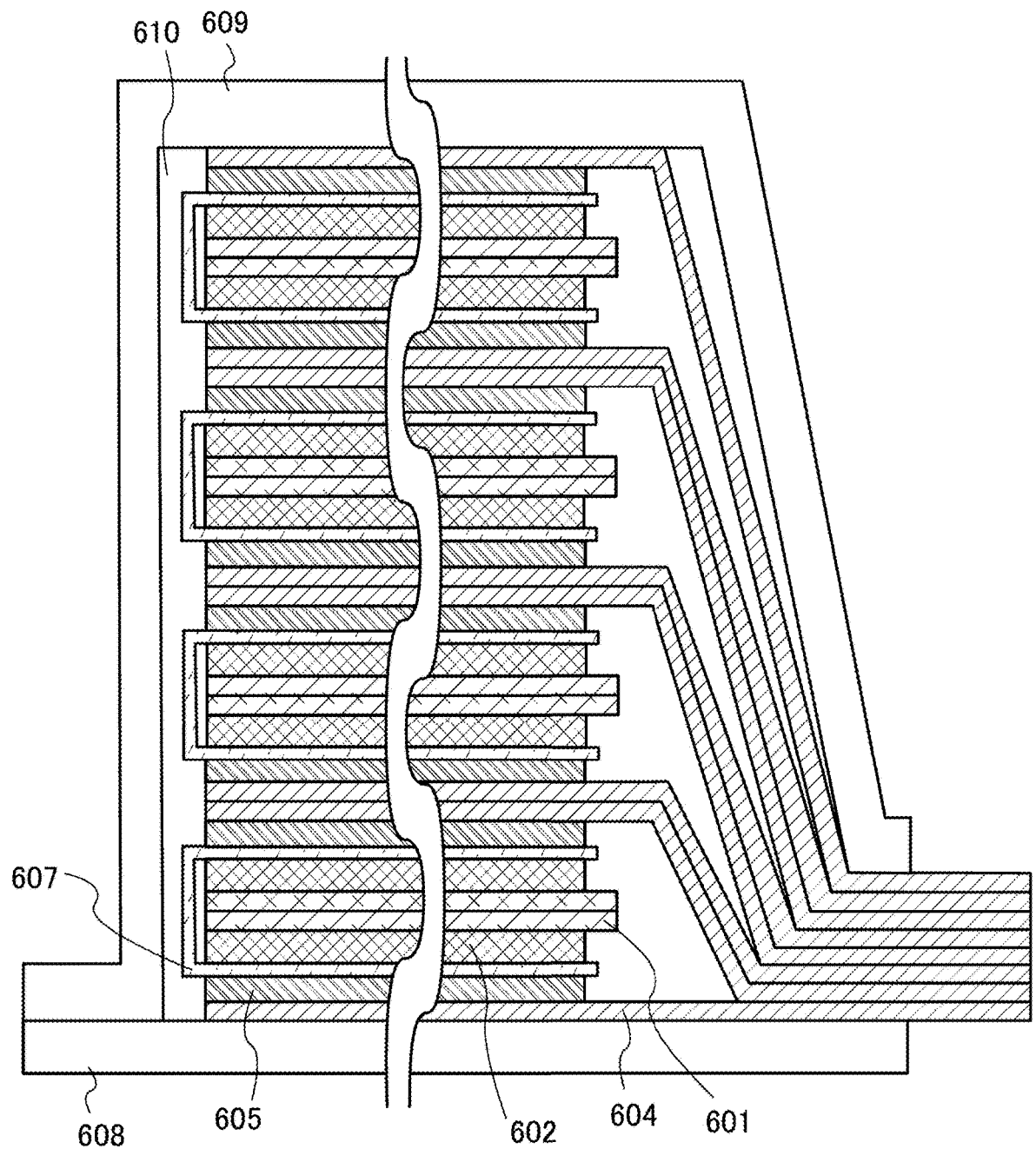
FIG. 6 is a cross-sectional view illustrating one embodiment of the present invention.

FIG. 6 is a schematic cross-sectional view of the secondary battery. In this secondary battery, sheet-like positive electrode current collectors 601, sheet-like positive electrode active material layers 602, separators 607, negative electrode current collectors 604, and negative electrode active material layers 605 are stacked, the other region is filled with an electrolytic solution 610, and these components are enclosed by a film 608 and an exterior body 609 made of a film with a depressed portion.

As illustrated in FIG. 6, the number of electrode layers is 16. The structure shown in FIG. 6 includes eight layers of negative current collectors 604 and eight layers of positive electrode current collectors 601, i.e., 16 layers in total. Note that in a cross-section of a negative electrode extraction portion illustrated in FIG. 6, the eight layers of negative electrode current collectors 604 are bonded by ultrasonic welding.

The thickness of the thinnest portion of the electronic device provided with the display portion (the thickness of the support structure body, the display portion, and the secondary battery overlapping with each other) is 3.2 mm. The thickness of the thickest portion of the electronic device, which is a portion where the display panel and the FPC are connected (a region where an external connection terminal is provided), is 6 mm. Note that an IC chip, a passive electronic component, or the like may be directly attached to the FPC. However, in that case, the IC chip or the like is not regarded as part of the FPC. In the case where a passive electronic component such as an L, C, or R component, a driver circuit IC chip, a CPU, a memory, or the like is directly attached to the FPC, that portion may be the thickest portion of the electronic device.

In this example, lithium iron phosphate is used as the positive electrode active material. By appropriately changing, for example, the positive electrode active material or the negative electrode active material so as to increase the volume energy density of the secondary battery, further reductions in size and weight can be achieved. For example, when lithium cobalt oxide (LiCoO$_2$) is used as the positive electrode active material, the volume energy density is increased. Thus, when a secondary battery having the same capacity as that of this example is fabricated using lithium cobalt oxide, the secondary battery can be thinner and lighter.

Electric power for displaying the image shown in FIG. 5 is supplied only from the secondary battery overlapping with the display portion.

As a matter of course, the image displayed on the display portion in FIG. 5 is not processed and is the one actually displayed in full color. The resolution of the display portion in FIG. 5 is 326 ppi. Each pixel includes three transistors, and an oxide semiconductor (InGaO$_3$(ZnO)$_m$) is used in the transistors. Connection terminals for charging and for video signal inputting are provided in an end portion of the support structure body and are connected to an external charging device or an external driving device when the electronic device is not in use by a user, i.e., at the time of charging or video signal inputting. When the electronic device is in use by a user, i.e., worn on an arm with an image displayed, a cord such as a wiring is not connected to an external driving device.

The electronic device shown in FIG. 5 has a total weight of 50 g or less and is light when worn on an arm. In addition, the electronic device presents an appearance with an attractive design and can thus be used as an accessory.

EXPLANATION OF REFERENCE

100: electronic device, 101: support structure body, 102: display portion, 103: secondary battery, 104: FPC, 105: arrow, 201: positive electrode current collector, 202: positive electrode active material layer, 203: positive electrode, 204: negative electrode current collector, 205: negative electrode active material layer, 206: negative electrode, 207: separator, 208: film, 209: exterior body, 210: electrolytic solution, 300: electronic device, 301: charger, 400: secondary battery, 401: support structure body, 402: display portion, 403: FPC, 404: FPC, 601: positive electrode current collector, 602: positive electrode active material layer, 604: negative electrode current collector, 605: negative electrode active material layer, 607: separator, 608: film, 609: exterior body, and 610: electrolytic solution.

This application is based on Japanese Patent Application serial no. 2013-147187 filed with Japan Patent Office on Jul. 16, 2013, the entire contents of which are hereby incorporated by reference.

What is claimed is:

1. An arm-worn electronic device comprising:
a structure body comprising a curved portion, the structure body being configured to be worn on a user's arm;
a display portion placed on one of surfaces of the structure body opposite to the user's arm when the structure body is worn on the user's arm; and
a secondary battery placed between the user's arm and the other of the surfaces of the structure body on a side of the user's arm when the structure body is worn on the user's arm,
wherein the secondary battery is placed on the curved portion,
wherein the display portion is placed on the curved portion,
wherein the secondary battery comprises a region overlapping the display portion with the structure body provided therebetween.

2. An arm-worn electronic device comprising:
a structure body comprising a curved portion, the structure body being configured to be worn on a user's arm;
a display portion placed on one of surfaces of the structure body opposite to the user's arm when the structure body is worn on the user's arm; and
a secondary battery placed between the user's arm and the other of the surfaces of the structure body on a side of the user's arm when the structure body is worn on the user's arm,
wherein the secondary battery is placed on the curved portion,
wherein the display portion is placed on the curved portion,
wherein the secondary battery comprises a region overlapping the display portion with the structure body provided therebetween,
wherein the secondary battery is sealed using a film,
wherein two end portions of the film overlap each other by folding the film,
wherein one side among four sides of the film comprises a folded portion, and
wherein the other three sides of the film has an adhesive layer.

3. The arm-worn electronic device according to claim 1,
wherein the secondary battery comprises a lead electrode,
wherein one of the other three sides comprises an edge placing the lead electrode, and
wherein the adhesive layer is between the lead electrode and the film.

* * * * *